(12) United States Patent
Adam et al.

(10) Patent No.: US 7,378,324 B2
(45) Date of Patent: May 27, 2008

(54) SELECTIVE LINKS IN SILICON HETERO-JUNCTION BIPOLAR TRANSISTORS USING CARBON DOPING AND METHOD OF FORMING SAME

(75) Inventors: Thomas N. Adam, Poughkeepsie, NY (US); Rajendran Krishnasamy, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 11/308,503

(22) Filed: Mar. 30, 2006

(65) Prior Publication Data

US 2007/0238258 A1    Oct. 11, 2007

(51) Int. Cl.
*H01L 21/331*    (2006.01)
(52) U.S. Cl. ............... 438/350; 438/321; 438/363; 438/372; 257/E21.379
(58) Field of Classification Search ........... 438/321, 438/349, 350, 363; 257/E21.379
See application file for complete search history.

(56) References Cited

U.S. PATENT DOCUMENTS

| 6,642,096 B2* | 11/2003 | Dutartre et al. ............ 438/234 |
| 6,667,489 B2* | 12/2003 | Suzumura et al. ............ 257/12 |
| 6,852,602 B2* | 2/2005 | Kanzawa et al. ............ 438/312 |
| 2002/0192918 A1* | 12/2002 | Takagi et al. ............ 438/350 |
| 2003/0189239 A1* | 10/2003 | Kalnitsky et al. ............ 257/586 |

\* cited by examiner

*Primary Examiner*—George Fourson
*Assistant Examiner*—Julio J Maldonado
(74) *Attorney, Agent, or Firm*—Schmeiser, Olsen & Watts; Steven Capella (57) ABSTRACT

Bipolar transistors and methods of forming the bipolar transistors. The method including forming a P-type collector in a silicon substrate; forming an intrinsic base on the collector, the intrinsic base including a first N-type dopant species, germanium and carbon; forming an N-type extrinsic base over a first region and a second region of the intrinsic base, the first region over the collector and the second region over a dielectric adjacent to the collector, the N-type extrinsic base containing or not containing carbon; and forming a P-type emitter on the first region of the intrinsic base.

15 Claims, 10 Drawing Sheets

SELECTIVE LINKS IN SILICON HETERO-JUNCTION BIPOLAR TRANSISTORS USING CARBON DOPING AND METHOD OF FORMING SAME

FIELD OF THE INVENTION

The present invention relates to the field of hetero-junction bipolar transistors; more specifically, it relates to structures of hetero-junction bipolar transistors having carbon doped regions and methods of fabricating hetero-junction bipolar transistors having carbon doped regions.

BACKGROUND OF THE INVENTION

A high-speed hetero-junction bipolar transistor (HBT) utilizes a thin extrinsic base region and even thinner intrinsic base region. The fabrication of a high-speed HBT is complicated by the need to control the dopant profiles of the semiconductor dopants in these thin base regions. If the intrinsic base diffusion becomes too wide, the speed of the HBT decreases. If the intrinsic and extrinsic base regions do not link, then the gain of the HBT decreases. Current fabrication techniques do not adequately address both of these problems. Therefore, there is a need for a method of fabricating HBT devices that provides intrinsic base width control and intrinsic and extrinsic base linking.

SUMMARY OF THE INVENTION

A first aspect of the present invention is a method of forming a transistor, comprising: forming a P-type collector in a silicon substrate; forming an intrinsic base on the collector, the intrinsic base including an N-type dopant species, germanium and carbon; forming an N-type extrinsic base over a first region and a second region of the intrinsic base, the first region over the collector and the second region over a dielectric adjacent to the collector; and forming a P-type emitter on the first region of the intrinsic base.

A second aspect of the present invention is a method of forming a transistor, comprising: forming a P-type collector in a silicon substrate; forming an intrinsic base on the collector, the intrinsic base including a first N-type dopant species, germanium and carbon; forming an N-type extrinsic base over a first region and a second region of the intrinsic base, the first region over the collector and the second region over a dielectric adjacent to the collector, the extrinsic base including a second N-type dopant species and carbon; and forming a P-type emitter on the first region of the intrinsic base.

A third aspect of the present invention is a bipolar transistor, comprising: a P-type collector in a silicon substrate; an intrinsic base on the collector, the intrinsic base including a first N-type dopant species, germanium and carbon; an N-type extrinsic base over a first region and a second region of the intrinsic base, the first region over the collector and the second region over a dielectric adjacent to the collector, the N-type extrinsic base including a second N-type dopant species; and a P-type emitter on the first region of the intrinsic base.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1 through 3 and 4A through 10A are cross-sectional views illustrating fabrication of an HBT according to embodiments of the present invention and FIGS. 4B, 5B, 6B, 7B, 8B, 9B and 10B are magnified portions of corresponding FIGS. 4A, 5A, 6A, 7A, 8A, 9A and 10A;

DETAILED DESCRIPTION OF THE INVENTION

Figure 1:
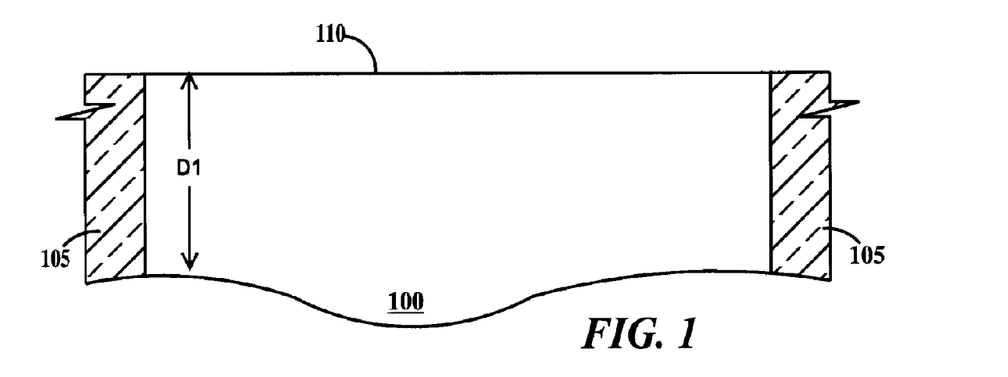

FIGS. 1 through 3 and 4A through 10A are cross-sectional views illustrating fabrication of an HBT according to embodiments of the present invention and FIGS. 4B, 5B, 6B, 7B, 8B, 9B and 10B are magnified portions of corresponding FIGS. 4A, 5A, 6A, 7A, 8A, 9A and 10A. In FIG. 1, a deep trench isolation 105 is formed in a single-crystal silicon substrate 100. In one example, deep trench isolation 105 is formed by etching trenches in regions of substrate 100 using a reactive ion etch (RIE), depositing a silicon oxide to fill the trenches and then performing a chemical-mechanical polish to form a planar surface. Deep trench isolation 105 extends from a top surface 110 of substrate 100 a distance D1 into the substrate.

Figure 2:
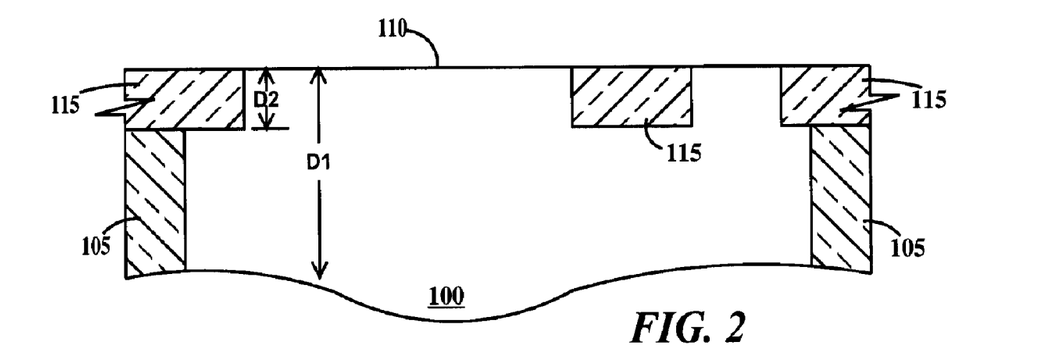

In FIG. 2, shallow trench isolation 115 is formed in substrate in a similar manner to that used to form deep trench isolation 105. Shallow trench isolation 115 extends from top surface 110 of substrate 100 a distance D2 into the substrate. D1 is greater than D2.

Figure 3:
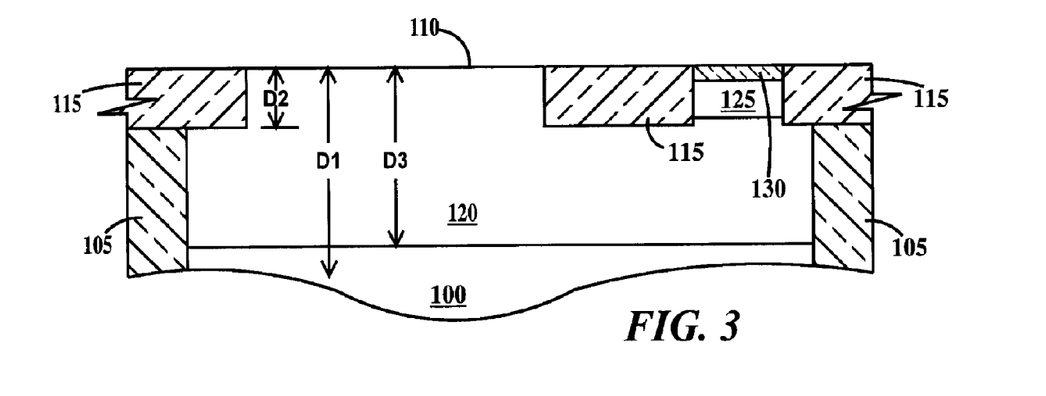

In FIG. 3, a collector 120 is formed in substrate 100. Collector 120 is bounded by deep trench isolation 105 and regions of shallow trench isolation 115 formed over the deep trench isolation. Collector 120 extends from top surface 110 of substrate 100 a distance D3 into the substrate. D2 is less than D3 and D3 is less than D1. In one example, collector 120 is formed by ion implantation of a P-dopant type species. In one example, collector 120 is formed by ion implantation of a boron species to an average concentration of between 1E19 atm/cm$^3$ and about 1E21 atm/cm$^3$. Formed in collector region 120 is a collector contact 125. Collector contact 125 is bounded by shallow trench isolation 115. In one example, collector contact 125 is formed by ion implantation of a P-dopant type species. In one example, collector contact 125 is formed by ion implantation of a boron species to an average concentration of between 1E19 atm/cm$^3$ and about 1E21 atm/cm$^3$.

A dielectric layer 130 is formed over collector contact 125 to limit epitaxial growth over the collector contact in subsequent processing. In one example, dielectric layer 130 may comprise a layer of silicon dioxide, a layer of silicon nitride a layer of polysilicon (over a layer of silicon dioxide) or combination thereof. While shown recessed below top surface 110 of substrate 100, dielectric layer 130 may be formed on top surface 110 and an opening in the dielectric layer formed over collector 120.

Figure 4A:
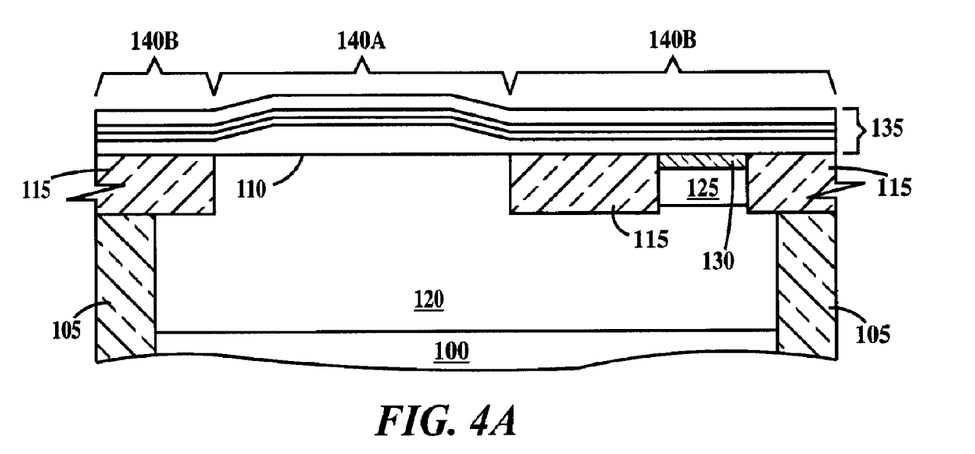
Figure 4B:
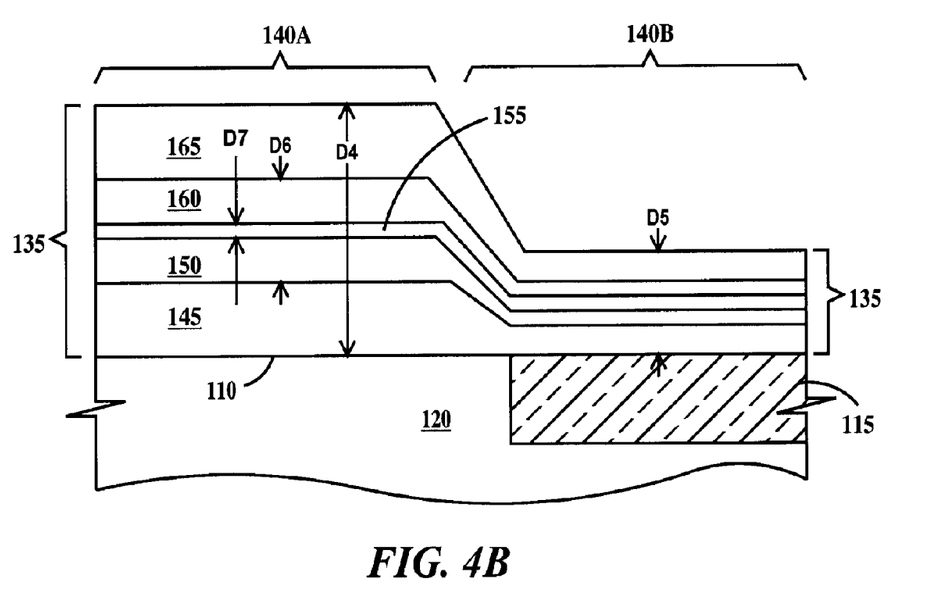

In FIGS. 4A and 4B, an intrinsic base 135 is formed on substrate 100. An epitaxial growth process described infra forms intrinsic base 135. Intrinsic base 135 includes a single-crystal intrinsic base region 140A over collector 120 and a polysilicon intrinsic base region 140B over shallow trench isolation 115 and dielectric layer 130.

In FIG. 4B the structure of intrinsic base 135 is more clearly illustrated. Intrinsic base 135 includes, from top surface 110 upwards, a first intrinsic silicon layer 145, a first silicon/geranium (SiGe) layer 150, a doped SiGe layer 155, a second SiGe layer 160 and a second intrinsic layer 165. Intrinsic base region 140A has a thickness D4 and intrinsic base region 140B has a thickness D5, where D4 is greater than D5. In one example D4 is equal to or less than 0.2 microns. First SiGe layer 150, doped SiGe layer 155 and second SiGe layer 160 have a combined thickness of D6 and doped SiGe layer 155 has a thickness D7. In one example D6 is equal to or less than 0.1 microns. In one example D7 is equal to or less than 0.03 microns. Each of first intrinsic silicon layer 145, first silican/geranium (SiGe) layer 150, doped SiGe layer 155, second SiGe layer 160 and second intrinsic layer 165 is thicker in base region 140A than in base region 140B.

In one example, the Ge concentration of first SiGe layer 150, doped SiGe layer 155 and a second SiGe layer is graded such that a Ge concentration in second SiGe layer 160 is greater than a Ge concentration in doped SiGe layer 155, which in turn is greater than a Ge concentration in first SiGe layer 150.

Doped SiGe layer 155 is doped N-type. In one example, doped Si/Ge layer 155 is doped with phosphorous to a peak concentration between about $1E19$ atm/cm$^3$ and about $5E20$ atm/cm$^3$. First SiGe layer 150, doped SiGe layer 155 and second SiGe layer are also doped with carbon. In one example, first SiGe layer 150, doped SiGe layer 155 and second SiGe layer are doped to a carbon concentration equal to or less than 0.2 atom-percent carbon.

In a chemical vapor deposition (CVD) processes gases are introduced into a heated chamber that will decompose into a volatile component that is removed from the chamber and a solid that will deposit on substrates in the chamber.

In a first example, intrinsic base 135 may be fabricated in an ultra-high vacuum (less than 2 millitorr) CVD (UH-VCVD) system in the following sequence of steps: (1) grow first intrinsic silicon layer 145 using, for example a gas flow including silane, (2) grow first Si/Ge layer 150 by introducing Ge into the gas flow, using for example germane (GeH$_4$), (3) grow doped SiGe layer 155 by introducing, for example, phosphine (PH$_3$) into the gas flow, (4) grow second Si/Ge layer 160 by turning off the diborane, (5) growing second intrinsic silicon layer 165 by turning off the GeH$_4$ and (6) turning off all gas flows. Carbon is introduced by including a carbon containing gas in the gas flow during steps (2), (3) and (4). Examples of suitable carbon containing gases include but are not limited to ethylene, ethane and methyl silane.

In a second example, intrinsic base 135 may be fabricated in an low pressure (less than 1 torr) CVD (LPCVD) system in the following sequence of steps: (1) grow first intrinsic silicon layer 145 using, for example a gas flow including silane, (2) grow a SiGe layer by introducing Ge into the gas flow, using for example GeH$_4$, (3) growing second intrinsic silicon layer 165 by turning off the GeH$_4$, (4) turning off all gas flows, (5) removing the substrate from the CVD chamber and placing the substrate in an ion implanter and (6) implanting a phosphorus containing species into the Si/Ge layer to form first silicon/germanium (SiGe) layer 150, doped SiGe layer 155 and second SiGe layer 160 or by or introducing PH$_3$ in the SiGe LPCVD process. Carbon is introduced by including a carbon containing gas in the gas flow during step (2). Examples of suitable carbon containing gases include but are not limited to ethylene, ethane and methyl silane.

Figure 5A:
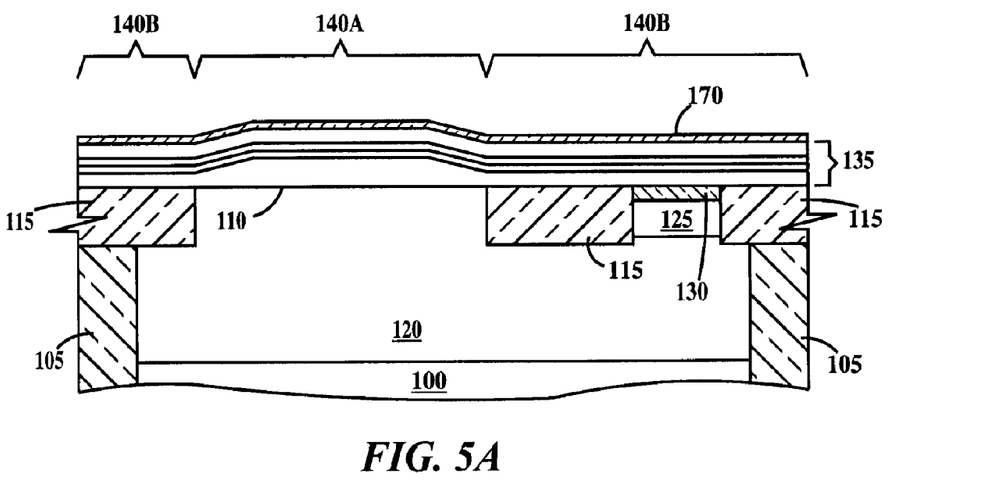
Figure 5B:
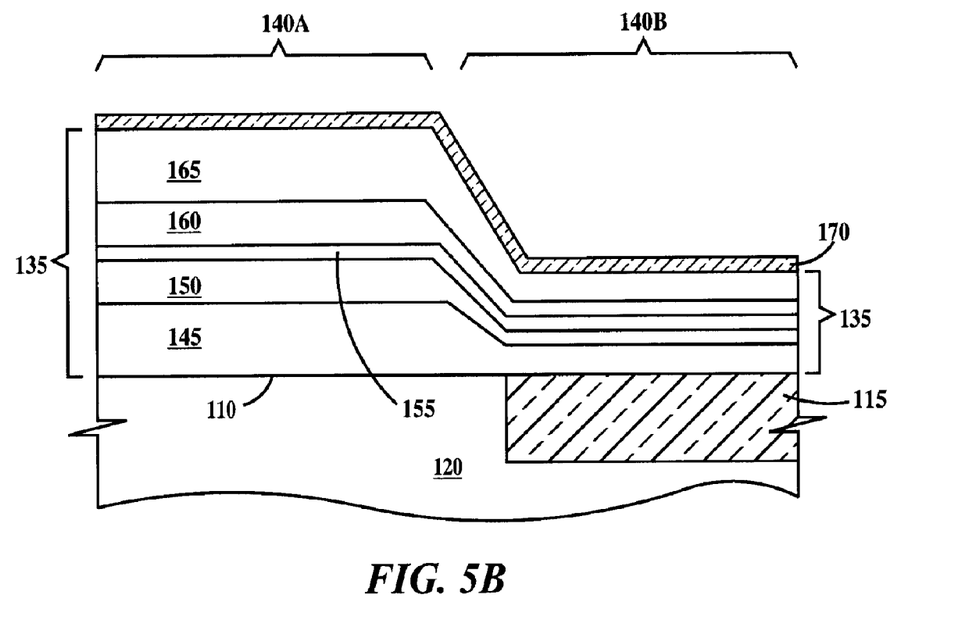
Figure 6A:
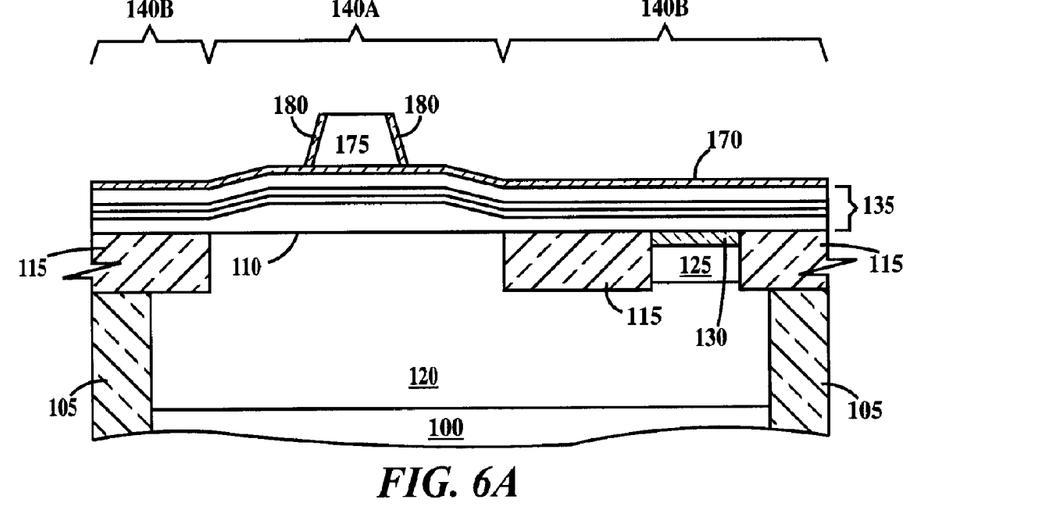
Figure 6B:
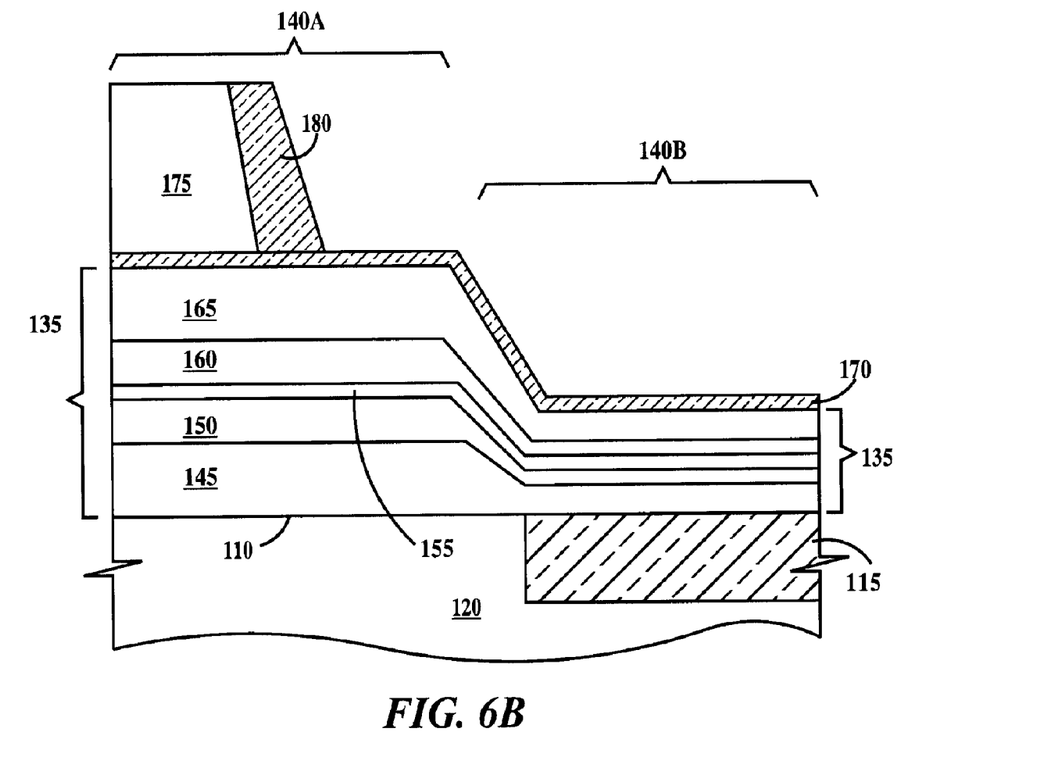
Figure 7A:
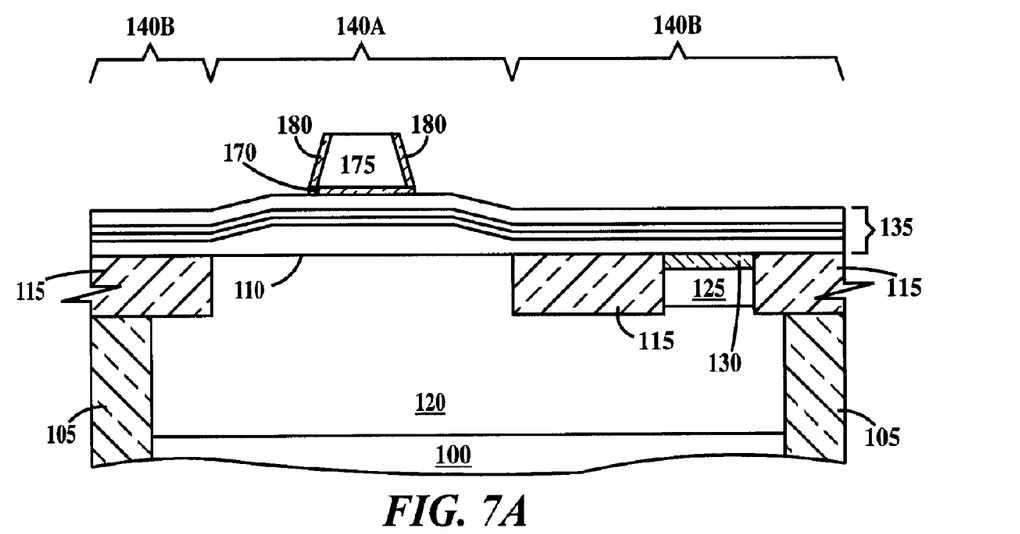
Figure 7B:
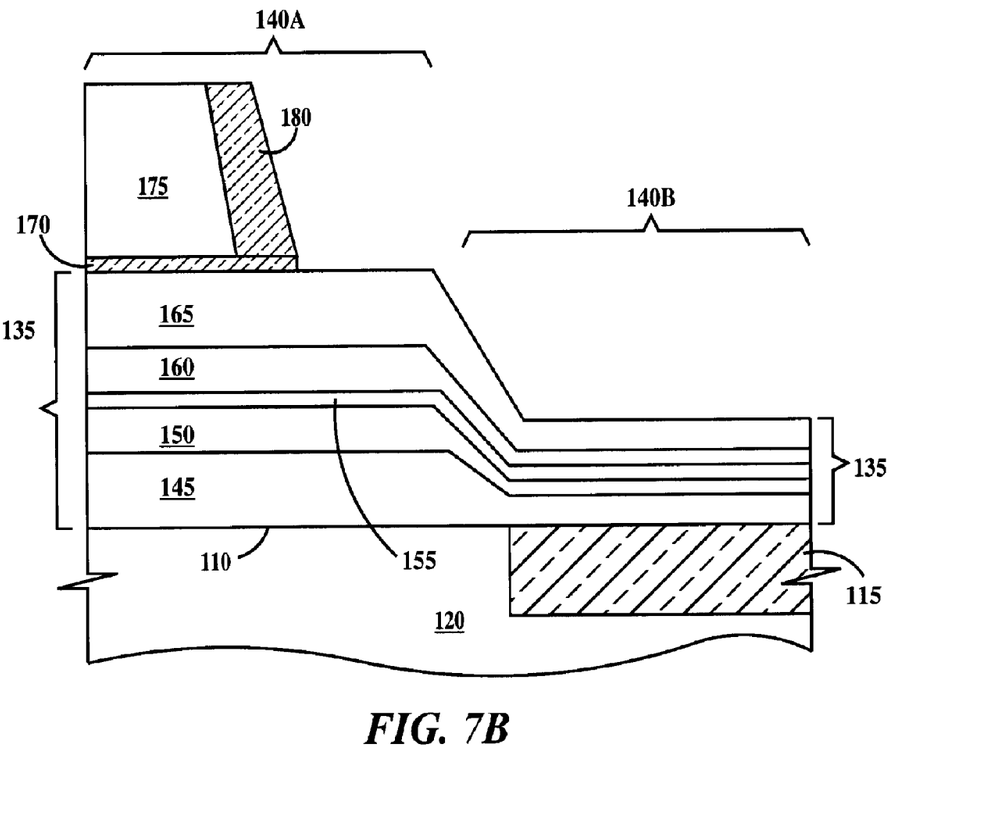

In FIGS. 5A and 5B, a dielectric layer 170 is formed on second intrinsic silicon layer 165. In FIGS. 6A and 6B, an emitter mandrel 175 is formed on dielectric layer 170 in intrinsic base region 140A and sidewall spacers 180 are formed on the sides of emitter mandrel 175. In one example, dielectric layer 170 comprises a layer of silicon dioxide and/or a layer of silicon nitride, emitter mandrel 175 is polysilicon and dielectric and dielectric sidewall spacers comprise silicon a layer of silicon dioxide and/or a layer of silicon nitride. In FIGS. 7A and 7B, dielectric layer 170 is removed where the dielectric layer is not protected by emitter mandrel 175 or sidewall spacers 180.

Figure 8A:
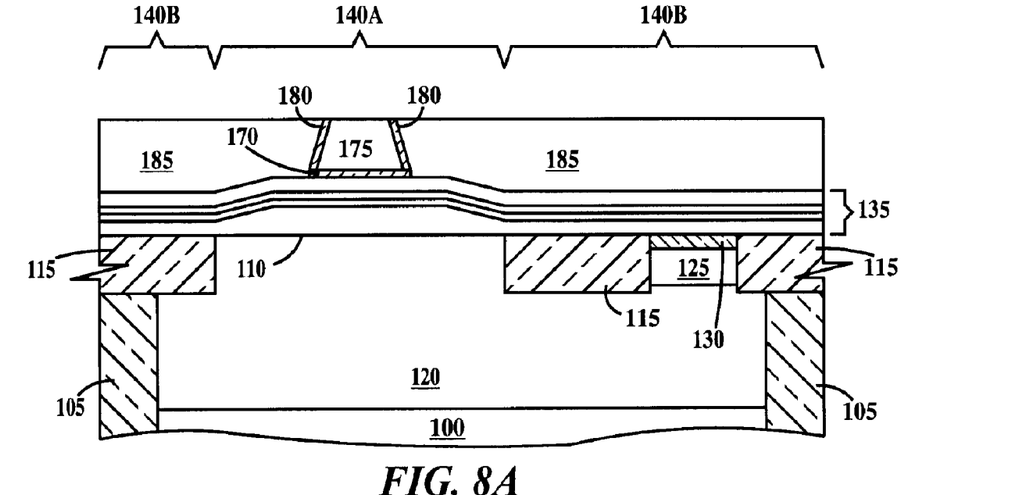
Figure 8B:
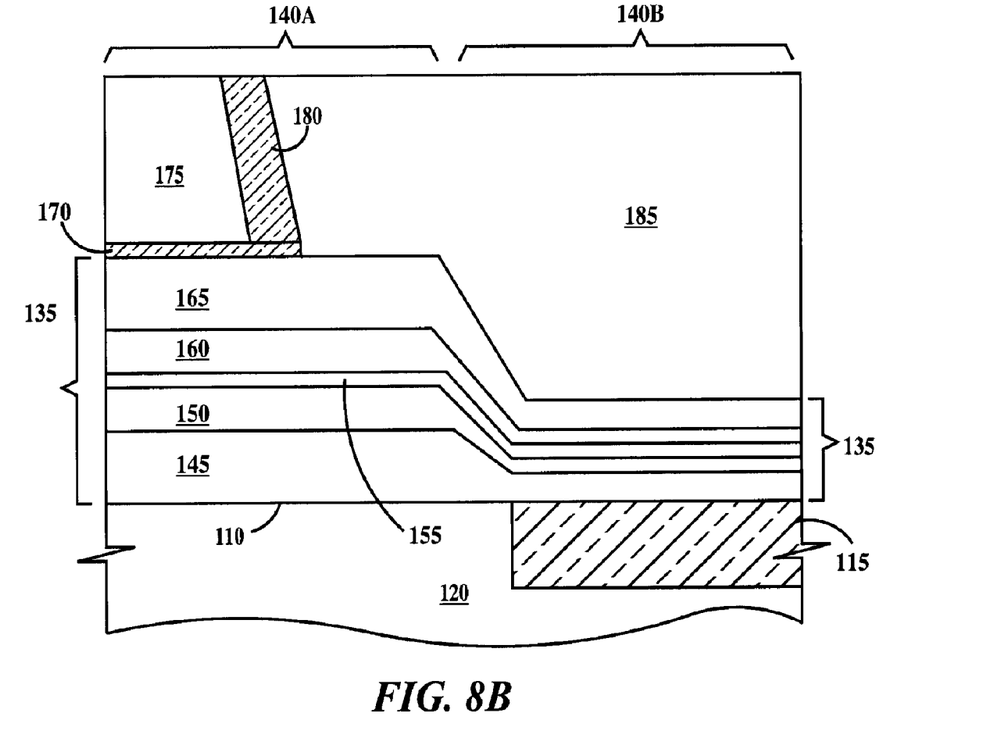

In FIGS. 8A and 8B, an extrinsic base 185 is formed. Extrinsic base is doped N type. In one example, extrinsic base 185 is doped with arsenic, antimony or both arsenic and antimony. In a first example, extrinsic base 185 is doped with arsenic to an average concentration of between about $1E19$ atm/cm$^3$ and about $1E21$ atm/cm$^3$. In a second example, extrinsic base 185 is doped with antimony to an average concentration of between about $1E19$ atm/cm$^3$ and about $1E21$ atm/cm$^3$.

In a first embodiment of the present invention, extrinsic base 185 may be formed by LPCVD using silane and either arsine (AsH$_3$) or stibine (SbH$_3$) or both AsH$_3$ and SbH$_3$. Alternatively, extrinsic base may be formed by LPCVD using silane and then doped by ion implantation of arsenic, antimony or both arsenic and antimony.

In a second embodiment of the present invention, extrinsic base 185 may be formed by LPCVD using silane, a carbon containing gas and either arsine or AsH$_3$ or SbH$_3$ or both AsH$_3$ and SbH$_3$. Examples of suitable carbon containing gases include but are not limited to ethylene, ethane and methyl silane. Alternatively, extrinsic base 185 may be formed by LPCVD using silane and a carbon containing gas and then doped by ion implantation of arsenic, antimony, or both arsenic and antimony. Alternatively extrinsic base 185 may be formed by LPCVD using silane and then doped by ion implantation of carbon and arsenic, carbon and antimony, or carbon, arsenic and antimony. In one example, extrinsic base 185 is doped to a carbon concentration equal to or less than 0.2 atom-percent carbon.

Figure 9A:
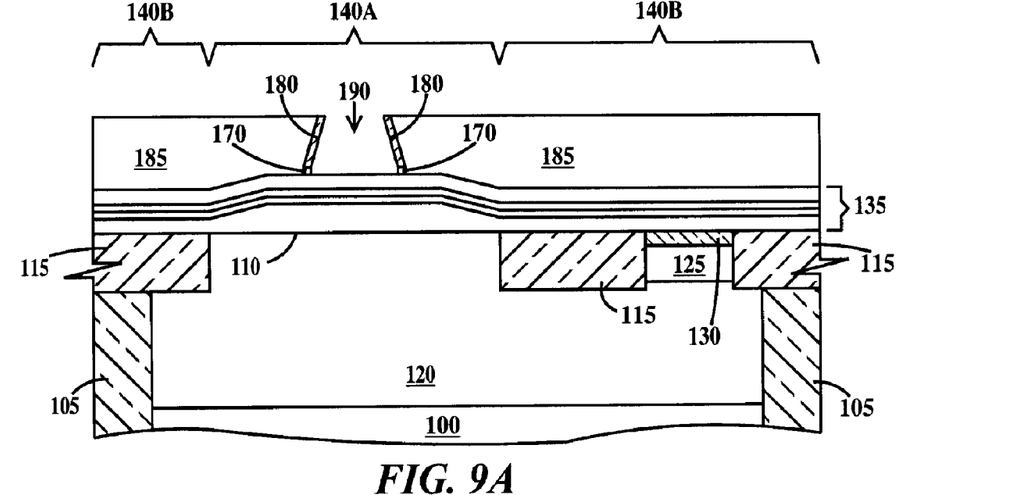
Figure 9B:
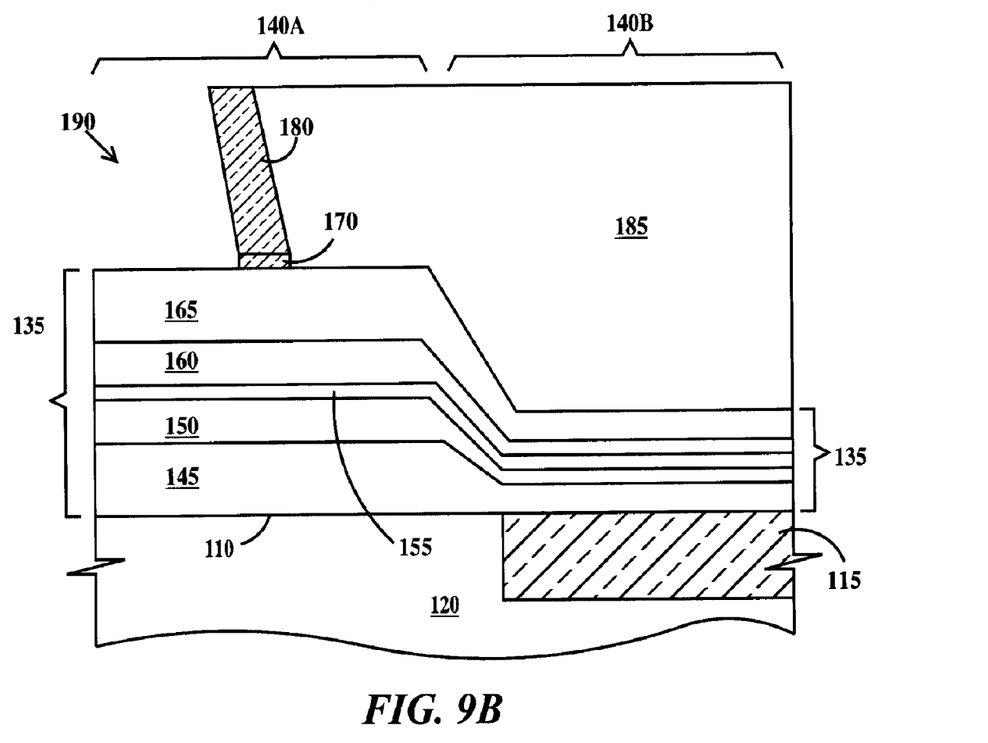
Figure 10A:
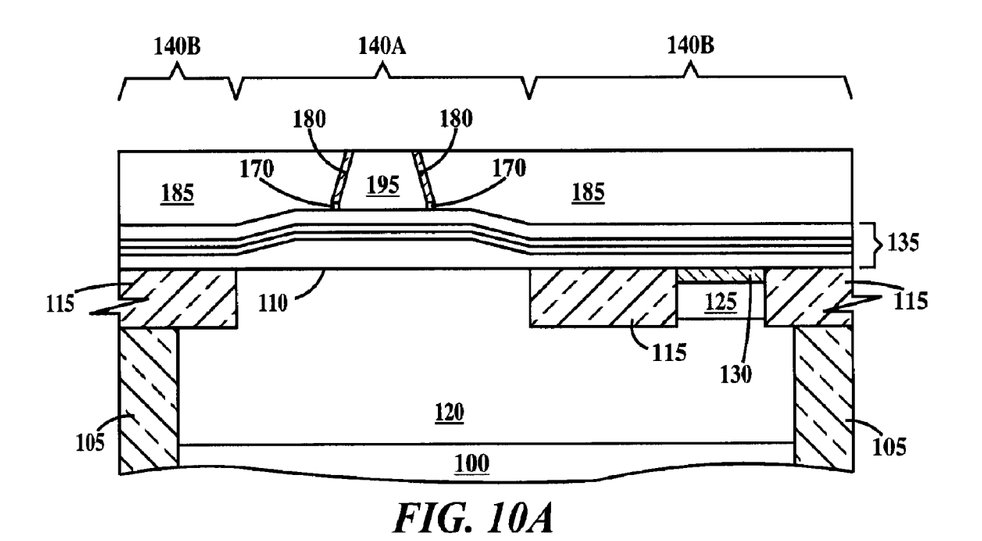
Figure 10B:
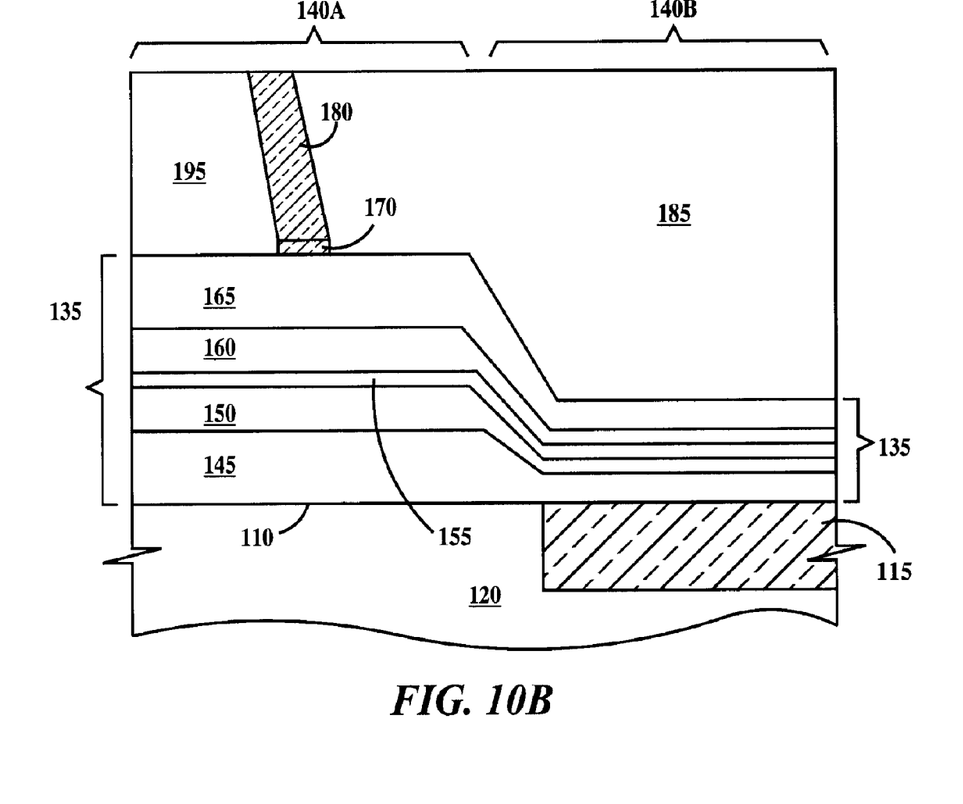

In FIGS. 9A and 9B, emitter mandrel 175 (see for example, FIG. 8A) and portions of dielectric layer 170 that are not protected by spacers 180 or extrinsic base 185 are removed to form a trench 190 where the emitter mandrel was. In FIGS. 10A and 10B an emitter 195 is formed in opening 190 (see for example FIG. 9A). In one example emitter 195 is doped P-type. In one example, emitter 195 is doped with boron to an average concentration of between about $1E19$ atm/cm$^3$ and about $1E21$ atm/cm$^3$. In a first example, emitter 195 is formed by LPCVD using silane and diborane followed by a CMP. In a second example, emitter 195 is formed by LPCVD using silane followed by a CMP followed by boron ion implantation. During emitter LPCVD or UHVCVD, a dielectric polish stop layer such as silicon nitride may protect extrinsic base 185. Alternatively, remote plasma-enhanced CVD (RPCVD) using HCl may be used to form emitter 195 and the CMP step eliminated.

Figure 11:
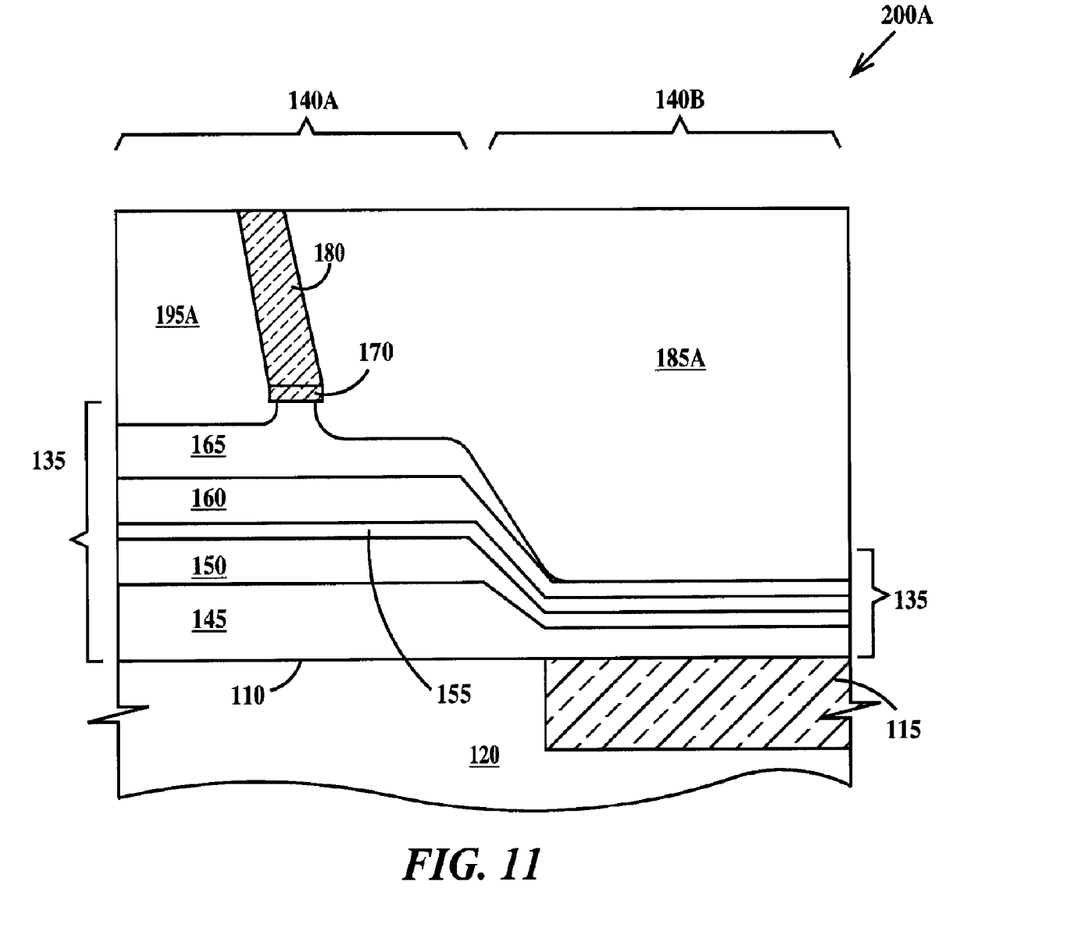
FIG. 11 is a view of FIG. 10B after an annealing process of the fabrication method according to a first embodiment of the present invention.

FIG. 11 is a view of FIG. 10B after an annealing process of the fabrication method according to the first embodiment of the present invention. In FIG. 11, a high temperature anneal is performed to complete a first PNP bipolar transistor 200A. The time and temperature are selected to allow the arsenic, antimony or arsenic and antimony dopants of extrinsic base 185 (see FIG. 10B) to out-diffuse forming annealed extrinsic base 185A. In one example, the anneal is performed at a temperature of between about 850° C. and about 1000° C. for a time equal or less than 30 seconds using a rapid thermal anneal (RTA) process.

After annealing, extrinsic base 185A links to (or is driven into) second SiGe layer 160 in intrinsic base region 140B but not under emitter 195A because of greater thickness of second intrinsic layer 165 in intrinsic base region 140A versus the thickness of second intrinsic layer 165 in intrinsic base region 140B. Linking is defined as formation of a physical and low resistance electrical contact between the layers being linked. In one example, low resistance may be considered a resistance of less than or equal to about 100 ohms. Linking of second intrinsic layer 165 to extrinsic base 185A reduces base resistance, increase base current (and gain) and increase the maximum operating frequency of the transistor.

The boron dopant in emitter 195 (see FIG. 10B) also out-diffuses to form emitter 195A. However, the carbon in doped SiGe layer 155 retards the phosphorous in doped SiGe layer 155 from out-diffusing any appreciable distance. Out-diffusion of phosphorus from doped SiGe layer 155 toward emitter 195A, is less than it would be in an otherwise identical PNP bipolar transistor fabricated without carbon, thus reducing base resistance, increasing the operating frequency of the transistor and allowing vertical scaling toward high performance devices.

Figure 12:
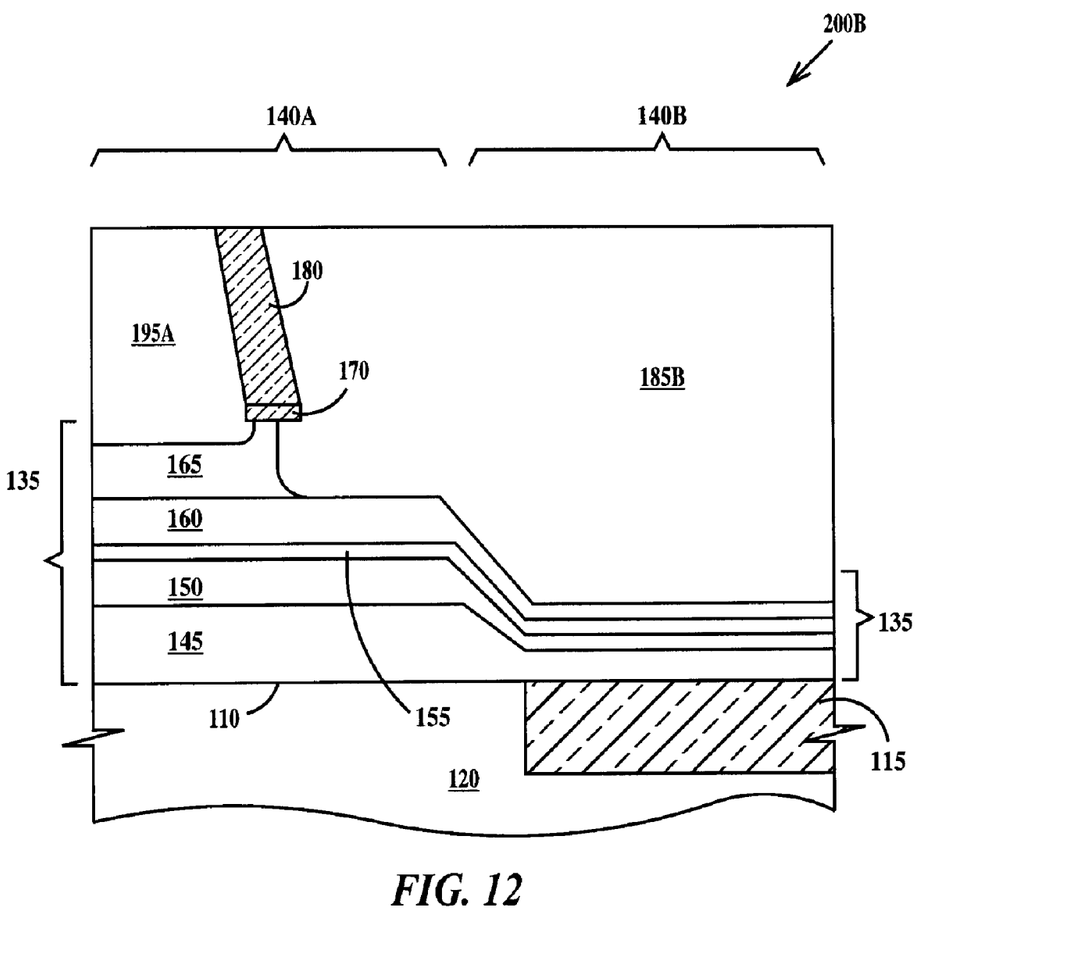
FIG. 12 is a view of FIG. 10B after an annealing process of the fabrication process according to a second embodiment of the present invention.

FIG. 12 is a view of FIG. 10B after an annealing process of the fabrication process according to the second embodiment of the present invention. In FIG. 12, a high temperature anneal is performed to complete a first PNP bipolar transistor 200B. The time and temperature are selected to allow the arsenic, antimony or arsenic and antimony dopants of extrinsic base 185 (see FIG. 10B) to out-diffuse forming annealed extrinsic base 185B. In one example, the anneal is performed at a temperature of between about 850° C. and about 1000° C. for a time equal or less than 30 seconds using a rapid thermal anneal (RTA) process.

After annealing, extrinsic base 185B links to second SiGe layer 160 in both intrinsic base regions 140A and 140B. However, extrinsic base 185B does not link to second SiGe layer 160 directly under emitter 195A. Linking of second intrinsic layer 165 to extrinsic base 185A reduces base resistance, increase base current (and gain) and increase the maximum operating frequency of the transistor of bipolar transistor 200B compared to an otherwise identical bipolar transistor fabricated without carbon in the extrinsic base.

The boron dopant in emitter 195 (see FIG. 10B) also out-diffuses to form emitter 195A. However, the carbon in doped SiGe layer 155 retards the phosphorous in doped SiGe layer 155 from out-diffusing any appreciable distance. Out-diffusion of phosphorous from doped SiGe layer 155 toward emitter 195A, is less than it would be in an otherwise identical PNP transistor fabricated without carbon in the intrinsic base, thus reducing base resistance and increasing the operating frequency of the transistor.

Table I gives examples of the change in diffusivity ($cm^2$/second) of boron, phosphorous, arsenic and antimony under the conditions indicated. The diffusion coefficient Di is the ratio of the diffusivity in silicon containing carbon over the diffusivity in silicon not containing carbon.

TABLE 1

| DOPANT SPECIES | Di | CONDITIONS |
| --- | --- | --- |
| Boron | 0.06 +− 0.01 | <1E18 carbon atoms/$cm^2$, anneal at 900° C. |

TABLE 1-continued

| DOPANT SPECIES | Di | CONDITIONS |
| --- | --- | --- |
| Boron | 0.30 +− 0.05 | 2E19 carbon atoms/$cm^2$, anneal at 900° C. |
| Boron | 1.0 +− 0.02 | 2E20 carbon atoms/$cm^2$, anneal at 900° C. |
| Arsenic | 7 +− 1 | 0.2 atoms percent carbon, anneal at 900° C. |
| Antimony | 8 +− 2 | 0.2 atom percent carbon, anneal at 900° C. |

Thus, the embodiments of the present invention provide a method of fabricating HBT devices with intrinsic base width control and intrinsic and extrinsic base linking.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming a transistor, comprising:
    forming a P-type collector in a silicon substrate;
    forming an intrinsic base on said collector, said intrinsic base including an N-type dopant species, germanium and carbon;
    forming an N-type extrinsic base over a first region and a second region of said intrinsic base, said first region over said collector and said second region over a dielectric adjacent to said collector;
    forming a P-type emitter on said first region of said intrinsic base; and
    wherein forming said intrinsic base includes:
        forming a first intrinsic silicon layer on said collector;
        forming a first silicon-germanium (SiGe) layer on said first intrinsic silicon layer and doping said first SiGe layer with carbon;
        forming an N-type doped SiGe layer on said first SiGe layer and doping said N-type doped SiGe layer with said N-type dopant species and carbon;
        forming a second SiGe layer on said first intrinsic silicon layer and doping said second SiGe layer with carbon; and
        forming a second intrinsic silicon layer on said second SiGe layer.

2. The method of claim 1, wherein said forming of said first intrinsic silicon layer, said first SiGe layer, said N-type doped SiGe layer, said second SiGe layer and said second intrinsic silicon layer is performed by chemical vapor deposition and said method further including:
    introducing said carbon and germanium during deposition of said first SiGe layer, said N-type doped SiGe layer and said second SiGe layer; and
    introducing said N-type dopant species into said N-type doped SiGe layer during deposition of said N-type doped SiGe layer.

3. The method of claim 1, wherein said forming of said first intrinsic silicon layer, said first SiGe layer, said N-type doped SiGe layer, said second SiGe layer and said second intrinsic silicon layer is performed by chemical vapor deposition and said method further including:

introducing said carbon and germanium during deposition of said first SiGe layer, said N-type doped SiGe layer and said second SiGe layer; and introducing said N-type dopant species into said N-type doped SiGe layer by ion implantation after deposition of said first intrinsic silicon layer, said first SiGe layer, said N-type doped SiGe layer, said second SiGe layer and said second an intrinsic silicon layer.

4. The method of claim 1, further including performing a high-temperature annealing, said high temperature annealing driving said extrinsic base into said second SiGe layer in said second region of said intrinsic base.

5. The method of claim 1, wherein said P-type collector and said P-type emitter are each doped with boron, said N-type doped SiGe layer is doped with phosphorous and said N-type extrinsic base is doped with arsenic, antimony or both arsenic and antimony.

6. The method of claim 1, further including:
selecting a chemical species for said N-type dopant species, said chemical species selected to have a diffusivity in silicon containing carbon that is less than a diffusivity of said chemical species in silicon without carbon.

7. A method of forming a transistor, comprising:
forming a P-type collector in a silicon substrate;
forming an intrinsic base on said collector, said intrinsic base including a first N-type dopant species, germanium and carbon;
forming an N-type extrinsic base over a first region and a second region of said intrinsic base, said first region over said collector and said second region over a dielectric adjacent to said collector, said extrinsic base including a second N-type dopant species and carbon;
forming a P-type emitter on said first region of said intrinsic base; and
wherein forming said intrinsic base includes:
forming a first intrinsic silicon layer on said collector;
forming a first silicon-germanium (SiGe) layer on said first intrinsic silicon layer and doping said first SiGe layer with carbon;
forming an N-type doped SiGe layer on said first SiGe layer and doping said N-type doped SiGe layer with said first N-type dopant species and carbon;
forming a second SiGe layer on said first intrinsic silicon layer and doping said second SiGe layer with carbon; and
forming a second intrinsic silicon layer on said second SiGe layer.

8. The method of claim 7, wherein said forming of said first intrinsic silicon layer, said first SiGe layer, said N-type doped SiGe layer, said second SiGe layer and said second intrinsic silicon layer is performed by chemical vapor deposition and said method further including:
introducing said carbon and germanium during deposition of said first SiGe layer, said N-type doped SiGe layer and said second SiGe layer; and introducing said first N-type dopant species into said N-type doped SiGe layer during deposition of said N-type doped SiGe layer.

9. The method of claim 7, wherein said forming of said first intrinsic silicon layer, said first SiGe layer, said N-type doped SiGe layer, said second SiGe layer and said second intrinsic silicon layer is performed by chemical vapor deposition and said method further including:
introducing said carbon and germanium during deposition of said first SiGe layer, said N-type doped SiGe layer and said second SiGe layer; and
introducing said first N-type dopant species into said N-type doped SiGe layer by ion implantation after deposition of said first intrinsic silicon layer, said first SiGe layer, said N-type doped SiGe layer, said second SiGe layer and said second an intrinsic silicon layer.

10. The method of claim 7, wherein said forming of said extrinsic base is performed by chemical vapor deposition said carbon is introduced in the form of carbon containing gas during said deposition.

11. The method of claim 7, wherein said forming of said extrinsic base is performed by chemical vapor deposition and said method further including:
introducing said second N-type dopant species and carbon during deposition of said extrinsic base.

12. The method of claim 7, wherein said forming of said extrinsic base is performed by chemical vapor deposition and said method further including:
introducing said carbon during deposition of said extrinsic base; and
introducing said second N-type dopant species by ion implantation after deposition of said extrinsic base.

13. The method of claim 7, further including performing a high-temperature annealing, said high temperature annealing driving said extrinsic base into said second SiGe layer in said second region of said intrinsic base and into said second SiGe layer in regions of said first region of said intrinsic base not directly under said P-type emitter.

14. The method of claim 7, wherein said P-type collector and said P-type emitter are each doped with boron, said N-type doped SiGe layer is doped with phosphorous and said N-type extrinsic base is doped with arsenic, antimony or both arsenic and antimony.

15. The method of claim 7, further including:
selecting a first chemical species for said first N-type dopant species, said first chemical species selected to have a diffusivity in silicon containing carbon that is less than a diffusivity of said first chemical species in silicon without carbon; and
selecting a second chemical species for said second N-type dopant species ; said second chemical species selected to have a diffusivity in silicon containing carbon that is greater than a diffusivity of said second chemical species in silicon without carbon.

* * * * *